(12) United States Patent
Nikoobakht

(10) Patent No.: US 8,618,481 B2
(45) Date of Patent: Dec. 31, 2013

(54) USE OF NOBLE METAL NANOPARTICLES AS LIGHT ABSORBERS AND HEAT GENERATORS IN THERMAL PHOTODETECTORS, SENSORS AND MICROELECTROMECHANICAL DEVICES

(75) Inventor: Babak Nikoobakht, Potomac, MD (US)

(73) Assignee: Babak Nikoobakht, Potomac, MD (US)

( * ) Notice: Subject to any disclaimer, the term of this patent is extended or adjusted under 35 U.S.C. 154(b) by 525 days.

(21) Appl. No.: 12/623,318

(22) Filed: Nov. 20, 2009

(65) Prior Publication Data

US 2010/0127172 A1   May 27, 2010

Related U.S. Application Data

(60) Provisional application No. 61/116,638, filed on Nov. 21, 2008.

(51) Int. Cl.
  *G01J 5/20*   (2006.01)
  *G01J 5/08*   (2006.01)
(52) U.S. Cl.
  USPC ........................ 250/338.1; 250/338.4
(58) Field of Classification Search
  USPC ........................... 250/338.1, 338.4
  See application file for complete search history.

(56) References Cited

U.S. PATENT DOCUMENTS

| | | | | |
|---|---|---|---|---|
| 5,450,053 | A | * | 9/1995 | Wood .............................. 338/18 |
| 5,688,699 | A | * | 11/1997 | Cunningham et al. .......... 438/54 |
| 6,160,257 | A | * | 12/2000 | Deb ........................... 250/338.1 |
| 7,015,453 | B2 | * | 3/2006 | Ogura et al. ................ 250/214.1 |
| 7,723,684 | B1 | * | 5/2010 | Haddon et al. .............. 250/338.1 |
| 2004/0214001 | A1 | * | 10/2004 | Oldenburg et al. ........... 428/404 |
| 2007/0109545 | A1 | * | 5/2007 | Chau et al. .................... 356/445 |
| 2008/0251723 | A1 | * | 10/2008 | Ward et al. ................. 250/338.4 |
| 2011/0315981 | A1 | * | 12/2011 | Xu et al. ......................... 257/43 |

OTHER PUBLICATIONS

Middlebrook et al. (2008). "Measurement of the Mutual Coherence Function of an Incoherent Infrared Field with a Gold Nano-wire Dipole Antenna Array." Int. J. Infrared Milli. Waves 29: p. 179-187.*
Codreanu et al. (2003). "Detection mechanisms in microstrip dipole antenna-coupled infrared detectors." Infrared Physics & Technology (44) 3: p. 155-163.*
Muhlschlegel et al. (2005). "Resonant Optical Antennas." Science 10: p. 1607-09.*

* cited by examiner

*Primary Examiner* — Casey Bryant

(57) ABSTRACT

This disclosure provides methods to integrate heat generating nanoparticles to microelectromechanical (MEMs) and photonic devices such as microbolometers and thermopiles for better photodetection and electrical energy generation. Nanoparticles include noble metal and semiconductor nanocrystals of different shapes, as light sensing and heat generating materials.

22 Claims, 6 Drawing Sheets

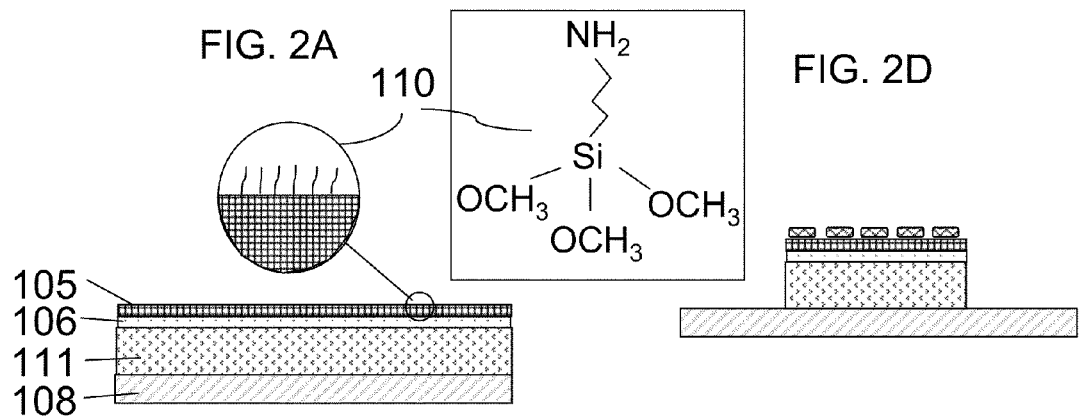
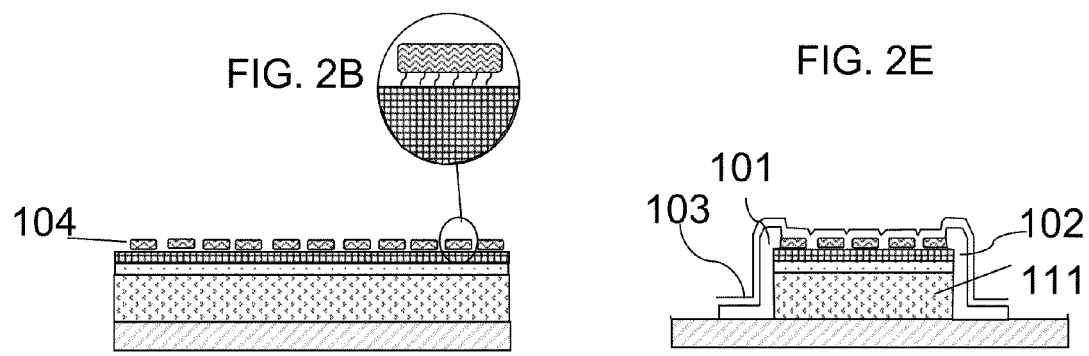
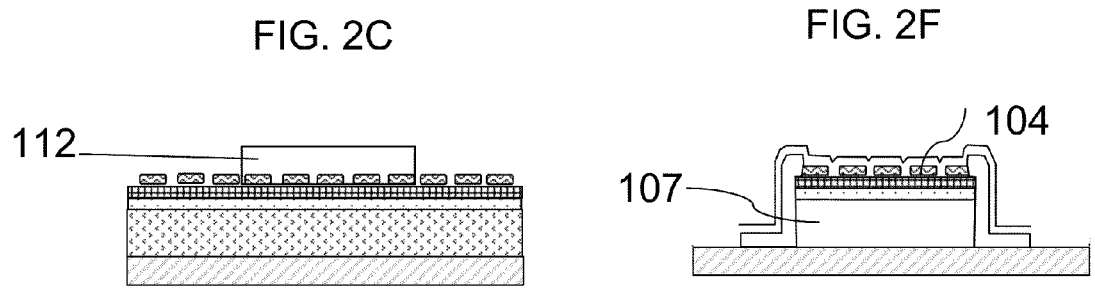

USE OF NOBLE METAL NANOPARTICLES AS LIGHT ABSORBERS AND HEAT GENERATORS IN THERMAL PHOTODETECTORS, SENSORS AND MICROELECTROMECHANICAL DEVICES

CROSS-REFERENCE TO RELATED APPLICATION

The present application claims priority to U.S. Provisional Application No. 61/116,638 filed Nov. 21, 2008, the disclosure of which is herein incorporated by references in its entirety

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

TECHNICAL FIELD OF INVENTION

This invention relates in general to application of noble metal and semiconductor nanocrystals for light absorption and heat generation in MEMs, photonic devices and visible and infrared detector technology. Particularly described in here is the use of noble metal nanocrystals and semiconductors in microbolometer detectors and thermopile sensors for achieving a superior performance. The invention thus includes improvements in thermal photodetectors, including infra-red cameras and thermal imaging cameras.

BACKGROUND OF THE INFORMATION

This invention pertains to thermal visible and infrared detectors of thin film resistance bolometer type in which visible or infrared radiation incident on the bolometer is absorbed, resulting in a temperature rise of the bolometer detector. This rise changes the resistance of the bolometer detector that can be transmitted or recorded by a read-out integrated circuit. Prior devices of the general type are shown for example in U.S. Pat. Nos. 5,045,123; 5,059,543; and 6,203,194.

This invention also pertains to detectors and sensors that contain thermopiles integrated to the new absorbing materials (e.g., gold nanorod). In the disclosed thermopile invention, the temperature difference between the cold and hot junctions of a thermocouple is improved due to the selective attachment of metal nanoparticles (e.g., nanorods) to the hot junctions of a thermocouple. The absorbed light in a metal nanocrystal, for instance, a gold nanorod is converted to heat due to the interaction between the incident light and the coherent oscillation of electrons in a metal nanorod. A nanorod detects the light in a wide range of wavelengths depending on its size and aspect ratio (ratio of length to width), thus can be used to generate heat in these regions as well. The light detection of nanorods, nanospheres or nanoshells is adjustable in the visible (300 to 700 nm) or infrared region (700 to 9000 nm) by tuning their aspect ratio, diameter, shell size and thickness, respectively. This makes all these shapes applicable for the disclosed invention.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

In this invention different classes of nanocrystals are introduced as strong light absorbers and heat generators. These nanomaterials due to their enormous light extinction coefficients exceed the performance of other light absorbing materials such as proteins, dyes, $VO_x$, amorphous Si, etc., in thermal detectors and other solid state devices that require heat to light conversion. One objective of this invention is to integrate metal and semiconductor nanoparticles into uncooled and cooled microbolometers in order to enhance their performance.

In the thermopile design, the metallic nanocrystals are coupled with individual thermocouples and only their hot junctions. This construction results in a significant improvement in the temperature difference between the cold and hot junctions of a given thermocouple and increases the voltage generation and sensitivity of a thermopile.

The disclosed microbolometers or thermopiles have multitudes of applications in visible and infrared imaging, x-ray microcalorimetry, energy generation and gas sensors, refrigeration and coolers.

The invention will become more clear from the following detailed description of embodiments, taken in conjunction with the drawings, wherein.

BRIEF DESCRIPTION OF THE DRAWINGS

FIG. 2 (A-F): Shows different steps of fabricating a nanoparticle-based microbolometer.

DETAILED DESCRIPTION OF THE INVENTION

Figure 1A:
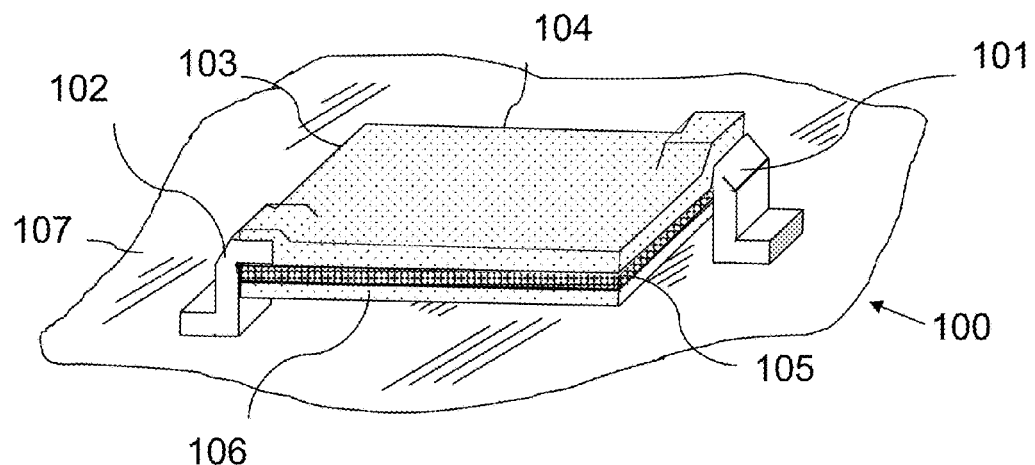
FIG. 1: (A) three-dimensional and (B) cross-sectional views of a nanoparticle-based microbolometer according to one aspect of the disclosure.

In this invention different forms of application of metal and semiconductor nanocrystals in microelectromechnical (MEMs) and photon-based devices such as microbolometers or thermopiles are illustrated. This invention may, however, be embodied in many different forms and should not be interpreted as limited to the examples set forth herein. Furthermore, the disclosure uses gold nanorods as an exemplary nanocrystal. However, nanomaterials of other noble metals such as silver, copper, platinum, and the like can be used in the devices disclosed herein. A nanocrystal surface could be protected by different organic molecules or inorganic layers. Also, whenever the disclosure refers to gold nanorods, it is to be understood that other nanocrystals shapes such as nanospheres, nanostars, nanoshells and nanoprisms (triangular shapes) may take the place of nanorods. A person skilled in the art would appreciate that the fabrication methods and devices disclosed herein can be used to incorporate other nanomaterials without undue experimentation and as such the scope of the disclosure is intended to include all those applications.

As used in this application, the term "nanorod" is intended to include solid cylindrical objects that have a width smaller than 100 nm and a length less than 2000 nm. In this application, the following terms are meant to be synonymous with "nanorod": rod shaped gold nanocrystals, cylindrical shaped gold nanocrystal, spheroidal shaped gold nanocrystal, gold nanorods, and one dimensional gold nanocrystals. The term "nanocrystal" is intended to include tiny crystals with at least one dimension less than 100 nm in size. The term "nanoparticle" is intended to include nanocrystals with different shapes that have at least one dimension less than 100 nm.

Gold nanorods due to their aspect ratio could absorb and scatter light in a broad region of the electromagnetic spectrum including visible and infrared. In the disclosed invention, gold nanorods regardless of their method of preparation can be used.

In this invention gold nanorods with aspect ratios larger than two are used due to their optical activities in the aforementioned regions. Such nanoparticles are prepared by a seed-assisted method and/or an electrochemical method using porous membranes as template for growth of one-dimensional metal nanorods. Examples of pore specifications of the used membranes include pore diameters of 10 to 30 nm and lengths of 0.3 micron to 2 microns. Examples of membrane materials could be polycarbonate or aluminum oxide.

In the disclosed photodetector designs, different ways of integrating metal nanoparticles to microbolometer are disclosed. In these designs, the generated heat by nanoparticles is coupled to an electrical resistor. The resistor conductivity changes due to the change in its temperature. The coupled resistor and nanocrystals (heat generating elements) are integrated to a read-out-integrated circuit, where change in the temperature can be recorded. In the use of metal nanorods as a light absorbing material, it is noteworthy to mention that the disclosed photodetector design is capable of realizing the polarization of the incident light.

In another embodiment, semiconductor nanocrystals in conjunction with metal nanoparticles are used to modify the thermal conductivity and resistivity of the sensing element and provide a larger response upon rise in the temperature of the sensor.

Figure 1B:
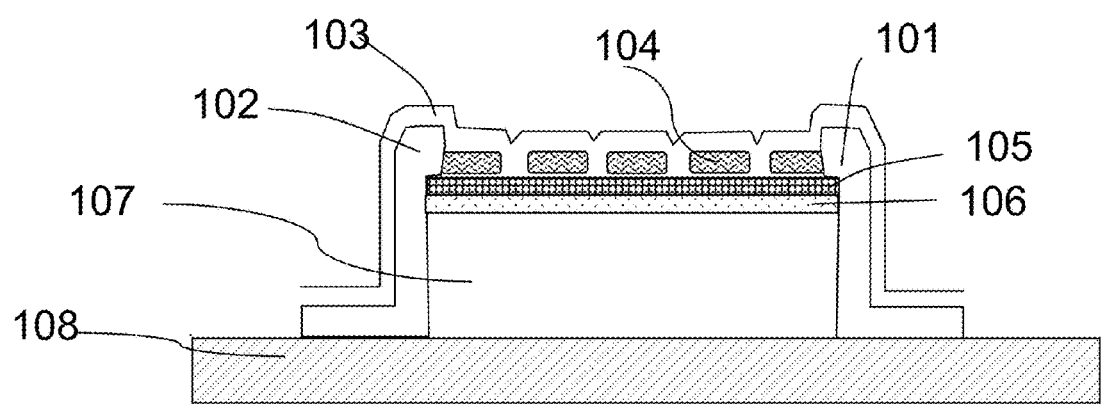

In FIG. 1A and FIG. 1B, three-dimensional and cross-sectional views of a microbolometer device (100) are shown, respectively, that contains gold nanorods (104) as the light absorbing material deposited on a semiconductor surface such as silicon (105). The device is built on any suitable substrate material, solid or flexible such as monocrystalline silicon wafer or an organic thin film. The silicon layer (105) is connected to two electrodes of (101) and (102). These electrodes are connected to readout electronics, not shown here. The sensing element is a layer of aligned or randomly oriented gold nanorods (104) with controlled density located on an amorphous silicon layer (105) with a thickness of 100 nm to 1000 nm. In this embodiment, gold nanorods as the heat generating elements significantly modify the resistivity of the silicon layer as compared to the case where only a silicon layer is used. In another embodiment, the layer (105) can be just silicon oxide with a thickness of 100 nm to 1500 nm. Layer (105) is formed on a silicon nitride layer (106) or any other suitable dielectric material with a thickness of 50 nm to 500 nm. In FIG. 1B it is shown that the sensing element (104, 105) is coated with a thin silicon oxide layer (103) with a thickness of 10 to 500 nm.

The strategy for depositing and aligning metal nanorods or nanoparticles is shown in FIG. 2 (A-F). In the first step, FIG. 2a, a silicon substrate (108) is coated with a polyimide layer (111) with a thickness ranging from 200 nm to 3000 nm. On this organic layer a thin dielectric film (106) such as silicon oxide, silicon nitride or any suitable dielectric material is formed. An amorphous silicon layer (105) with a thickness of 100 to 1000 nm is deposited on the first dielectric layer. The amorphous silicon layer (105) is doped with boron during deposition to obtain a low resistivity layer. Layer (105) can also be silicon oxide or a semiconductor that is transparent to the wavelength of the incident light. To this surface, a monolayer of a linking molecule (110) is attached by substrate submersion in a solution of an amino-silane molecule such as 3-aminopropyltriethoxy-silane. This molecule from its silicon side reacts with the silicon surface, while its nitrogen side is dangling freely. The nitrogen atom has the potential of binding to the surface of a gold nanorod. The carbon chain between the two functional groups can contain different number of carbon atoms ranging from 3 to 10.

The treated silicon surface (105) is dried with nitrogen gas and is exposed to a flow of a gold nanorod solution with a concentration range of 1 nanoMolar to 10 nanoMolar. The flow rate is changed between 1 cm/s to 20 cm/s. In the deposition process, as floating nanorods in solution anchor to nitrogen atoms of amino-silane molecules on the surface (105), they also align in the direction of the flow (shown in FIG. 2B) and completely anchor to the surface (105). Depending on the time period that the surface is exposed to the nanorod solution, the concentration of nanorods attached to the surface is changed.

The spacing between nanorods on a surface must be between 10 to 50 nm in order to avoid the interaction of their dipolar plasmon modes. This interaction, if permitted to occur, is destructive and rapidly reduces the sensitivity of nanorods to the incident light.

After the deposition of nanorods (104), the surface is dried with nitrogen gas and using known photolithography protocols, square patterns (112) are formed on the surface (FIG. 2C). These patterns are between 3 microns to 50 microns in one dimension. Nanorods underneath the photoresist (112) are kept intact, while the rest of the surface is etched to remove the nanorods (104), amorphous silicon (105), the dielectric (106) and the polyimide layer (111). After performing a photoresist lift off process, the surface (108) is decorated with pattern shown in FIG. 2D. Using conventional photolithography protocols, electrical contacts (101, 102) are then placed on the sensing elements and connected to a read-out system (FIG. 2E). A thin layer of silicon oxide (103) as a passivation layer is deposited on the entire silicon wafer (FIG. 2E). The final step, shown in (FIG. 2F), is releasing the sensing element by removal of the sacrificial polyimide layer (111).

In one embodiment, a thin titanium layer, 10 nm-25 nm, as mirror is deposited underneath the sensing element before deposition of the polyimide layer. Depending on the detection region of interest, the height of the standing structure (106) from its underlying silicon surface is varied between 200 nm to 2000 nm.

Each fabricated mircobolometer represents a pixel and is be between 3 to 50 microns square in size with a pitch of 10 to 100 microns. The disclosed embodiments demonstrate superior performances relative to the corresponding devices in the absence of gold nanorods. This is due to the fact that metal nanoparticles, e.g., gold nanorods, dissipate their lattice heat to the surrounding environment within tens of picoseconds. This results in an overall sensing layer (105) with a better thermal response time relative to a layer without metal nanoparticles. Equally important the other advantage of nanorods is that it allows reducing the size of the sensing pixel to dimensions that have not been possible yet. A smaller pixel size results in a faster response time and a faster detector. Different surface densities of gold nanorods are used in layer (105) to obtain the best performance of the nanoparticles-based microbolometer.

Figure 3A:
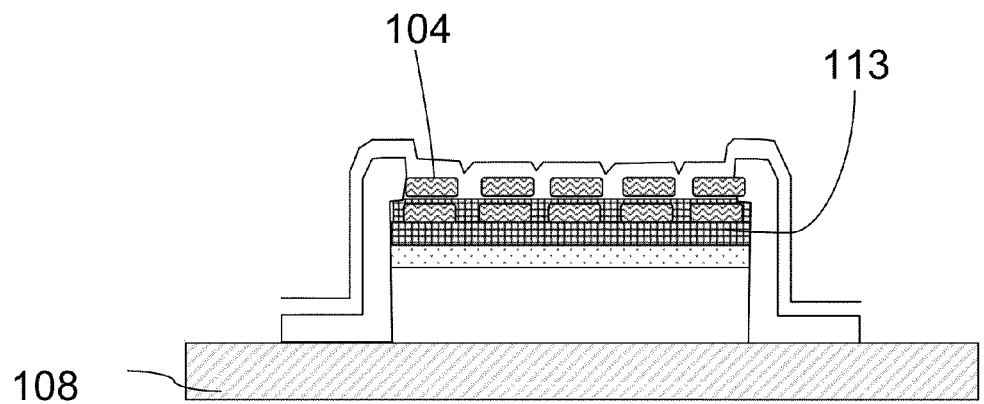
FIG. 3 (A): Illustrates a nanoparticle-based microbolometer in which the sensing element contains multilayers of silicon and gold nanorods according to one aspect of the disclosure. (B) Nanorods with different aspect ratios are deposited in different layers. In this design, a silicon oxide spacer is used between the conductive silicon layers.
Figure 3B:
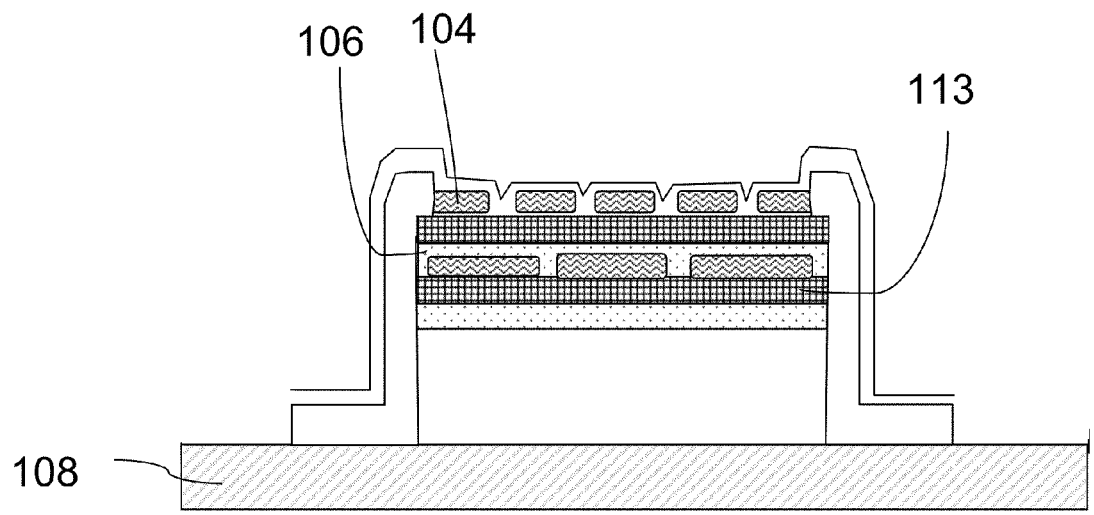

In another embodiment in FIG. 3A, the sensing element contains a double layer or multilayers of gold nanorods (104, 113). Fabrication of the first layer of the sensing element is similar to the embodiments shown in FIG. 2. For depositing extra layers of nanorods, a thin layer of amorphous silicon (106) with 50 to 300 nm thickness is deposited on the first layer of nanorods shown in FIG. 3A. This surface is treated with a monolayer of amino-silane (110) shown in FIG. 2, followed by deposition of nanorods (113). This process can be repeated as many cycles as desired until a suitable device response is obtained. In this sensing element, by stacking multiple layers of gold nanorods, the light absorption is increased, a feature that is absent in other inorganic sensing elements such as vanadium oxide, Si, etc. In another design, shown in FIG. 3B, nanorods (104) with different aspect ratios are deposited on different layers of silicon (113) that contains a silicon oxide spacer (106). In this design, the wavelength sensitivity of the sensing element widens, which results in a sensitive detector to a broad range of incident wavelengths.

Figure 4:
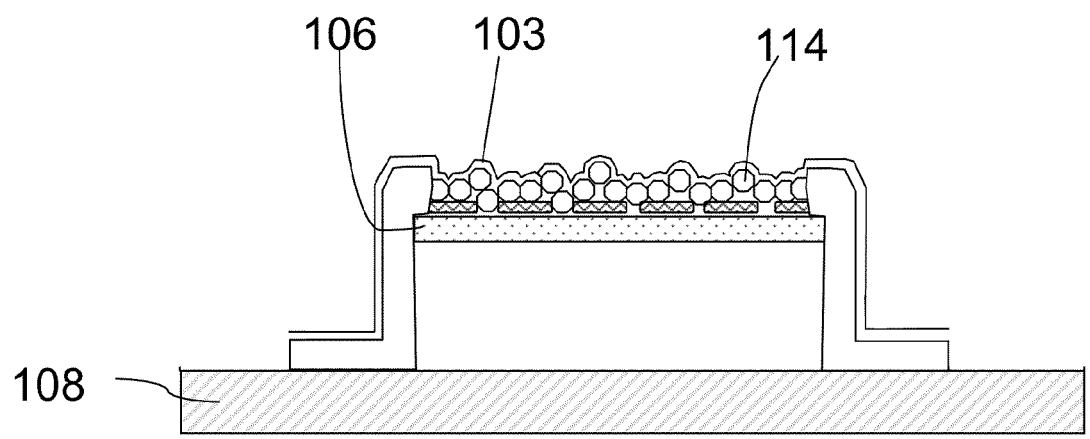
FIG. 4: Shows another design for a nanoparticle-based microbolometer in which the sensing element contains a layer of gold nanorods coated with semiconductor nanoparticles. The entire layer is coated with a silicon oxide layer according to one aspect of the disclosure.

In another embodiment in FIG. 4, the sensing element includes a single layer of aligned gold nanorods that is sensitized by semiconductor nanocrystals or quantum dots (114). The sensing element is located on a thin silicon oxide layer (106) with a thickness ranging from 200 nm to 1500 nm. Semiconductor nanocrystals and nanorods are passivated with a silicon oxide layer (103) (10 nm to 500 nm). In fabricating this multilayer structure, after nanorods are deposited (FIG. 2, layer 104), the substrate is dried with nitrogen gas and is submerged into hexane solution of a dithiol molecule such as hexandithiol for 10 min. to 240 min. The dithiol concentration ranges from 0.001 M to 0.1 M. The substrate is washed with hexane and dried again with nitrogen gas and immersed in a solution of semiconductor quantum dots such as cadmium selenide or lead selenide in an organic solvent. This results in attachment of quantum dots to the surface of gold nanorods and formation of a well-packed assembly of quantum dots. These nanocrystals allow current to pass through them. The band gap of the semiconductor nanocrystals, their size and the aspect ratio of the gold nanorods define the wavelength of the absorbed light and thus the sensing region. The electrical conductivity of these semiconductor nanocrystals is modified by the heat generated by gold nanorods. These sensing units conclude photodetectors that are capable of sensing light in the visible and infrared regions of the electromagnetic spectrum.

In this section, the utilization of metal nanoparticles, e.g. gold nanorods in thermocouples and thermopiles is disclosed. A thermocouple is a device which converts heat to electricity and is realized when two thermoelectric materials form two junctions with a certain temperature difference. The temperature difference generates a voltage that could be used for light detection, and electricity generation. In this invention, gold nanorods are integrated to the hot junction of a thermocouple device (200) in order to absorb the electromagnetic wave (e.g., visible or near-infrared) and generate heat more efficiently than a similar device but without gold nanorods. The presence of gold nanorods or other metal nanoparticles results in a larger temperature difference between the hot and cold junctions and thus generation of a stronger electric voltage.

Figure 5B:
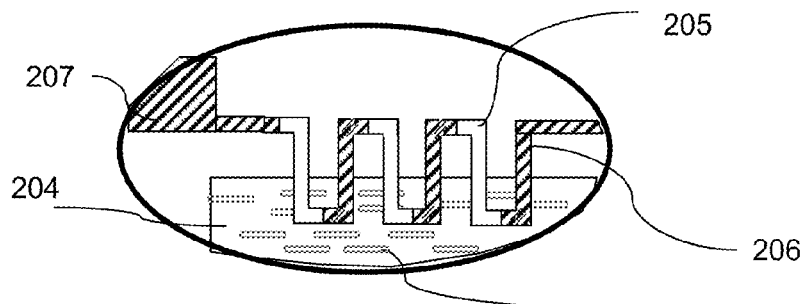
FIG. 5 (A): Illustrates a top view of a nanoparticle-thermopile detector. (B) Shows an enlarged view of serially linked thermocouples according to one aspect of the disclosure. (C) Shows a side view (cross-section) of the device shown in part (A).
Figure 5A:
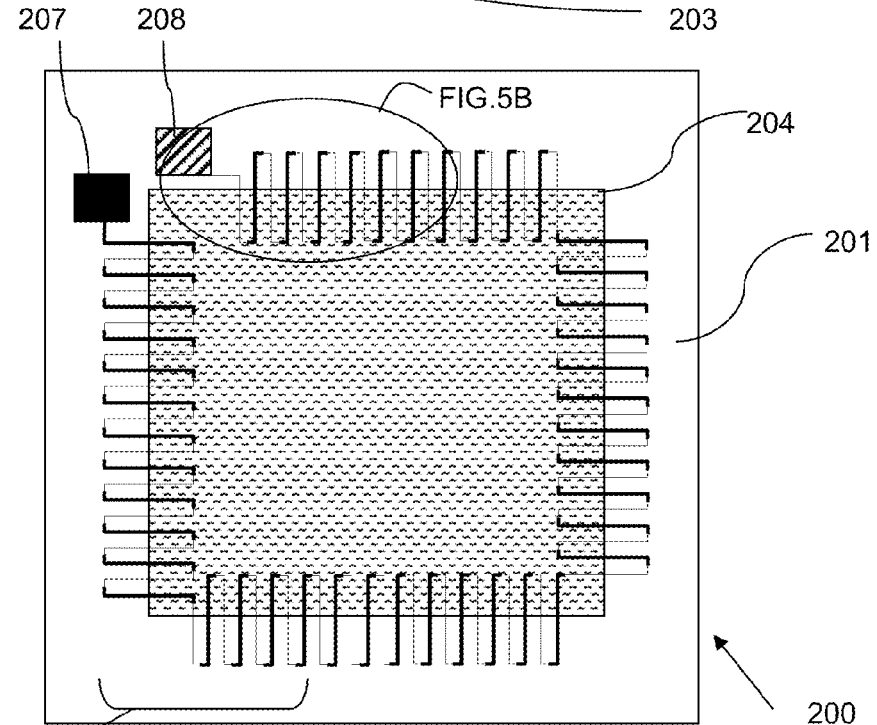
Figure 5C:
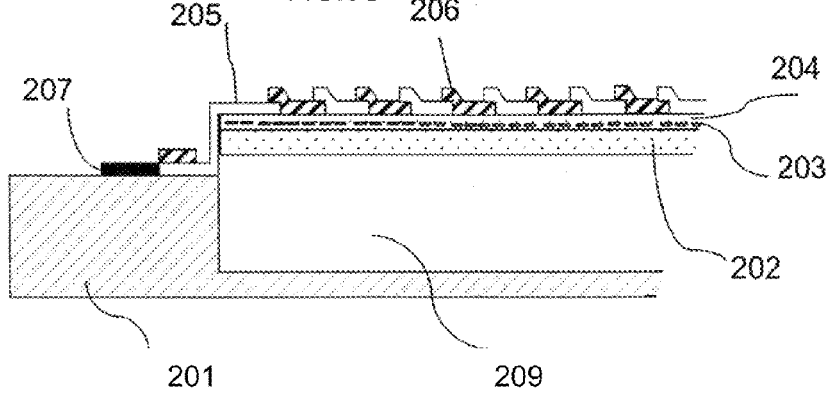

FIG. 5A shows a top view of the nanoparticles-thermopile detector. An enlarged view of this figure is shown in FIG. 5B, where serially linked thermocouples are packed on a planar surface. Each thermocouple consists of thermoelectric layers of (205) and (206). Examples for thermoelectric layers are polycrystalline silicon (205) and gold (206). Other pairs of electrodes such as p-type polycrystalline silicon and aluminum metal could be used as well. These thermocouples are placed on a squared pattern of a silicon oxide layer (204) that contains gold nanorods (203). Part of cross-section of this design is illustrated in FIG. 5C. All aforementioned layers are formed on a thin dielectric layer (202). In FIG. 5B, parts of the thermocouples that resides on the layer (202) form the hot junctions.

Referring to FIG. 6(A-D), fabrication steps of such a thermopile device is illustrated. In FIG. 6A, silicon surface using conventional photolithography patterning and etching is etched down to form square shaped trenches with 500 nm to 1000 nm depth (212). This step is followed by deposition of a sacrificial organic layer (211) in FIG. 6B. The organic layer can be a polyimide that is spin coated to produce a flat and homogeneous coverage on the entire silicon wafer. Therefore the organic layer not only fills the etched areas, but it covers the substrate with a certain thickness. This thickness is ranged from 500 nm to 2000 nm. If a dielectric layer (202) is to be placed in the device such a layer is deposited. This layer may be formed by depositing 200 nm to 300 nm of silicon nitride and 500 to 1200 nm of silicon oxide to form a multi-layer dielectric film on which the hot junctions of thermocouple devices are fabricated. Other thickness values or oxides such as aluminum oxide or zirconium oxide could be used to minimize the stress in the thin dielectric layer to avoid deformation of the device platform during operation.

Figure 6A:
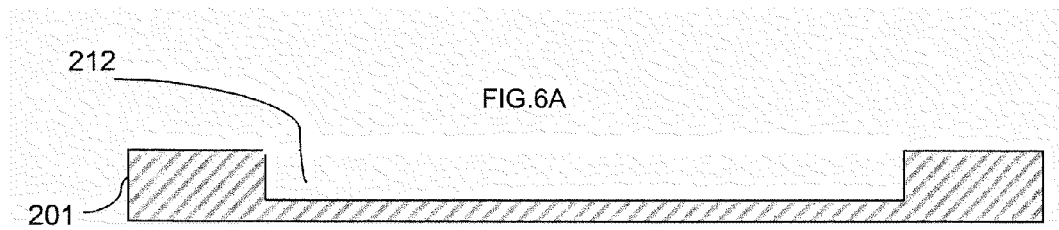
FIG. 6(A-E): Shows fabrication steps of a nanoparticle-based thermopile according to one aspect of the disclosure.
Figure 6B:
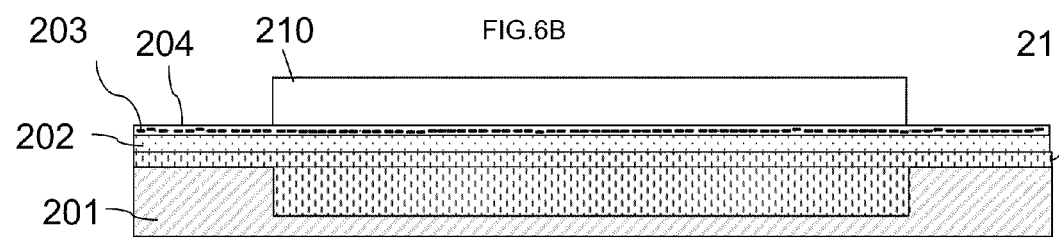
Figure 6C:
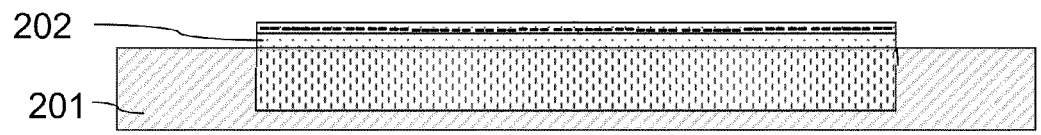
Figure 6D:
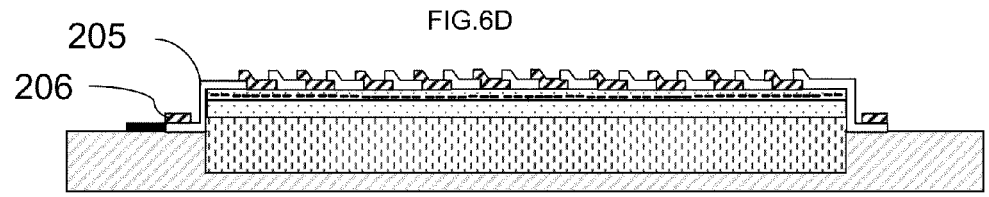
Figure 6E:
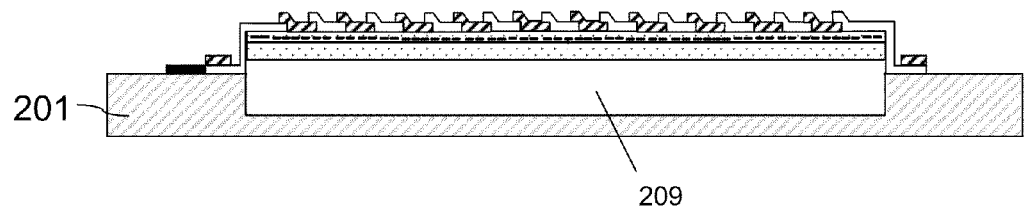

On this layer aligned nanorods are deposited as described earlier. Nanorods are coated with a silicon oxide layer (204) with 50 nm to 300 nm thickness. Referring to FIG. 6B, using conventional photolithography patterning techniques square shaped patterns of a photoresist (210) are exactly placed above the areas of silicon which are etched in step 6A. The purpose of layer (210) is to protect its underlying multilayer structure. This structure is etched using reactive ion etching and results in the structure shown in FIG. 6C. In this figure, square patterns (204) of silicon oxide film that contain gold nanoparticles (e.g., randomly oriented or aligned gold nanorods) are shown that are placed on the dielectric layer (202). Therefore layer (204) in FIG. 6C, exactly, resides on top of the etched area (212). Layer (204) acts as the light absorbing and heat generating layer. In FIG. 6D, thermoelectric layers, e.g., p-type polycrystalline silicon and titanium (or gold) are deposited using conventional photolithography patterning techniques to form the serially linked thermocouples. Placement of thermocouples is such that their hot junctions locate on layer (204) (refer to FIG. 5C). In FIG. 6E, etching of the sacrificial layer results in formation of an air dielectric layer between the layer (202) and silicon wafer (201).

It will be understood by those skilled in the art that the microbolometer detectors and thermopile sensors as disclosed above can be used in a variety of devices in place of prior bolometer detectors and thermopile sensors, such devices including thermal photodetectors, infra-red cameras and thermal imaging cameras.

In summary, nanoparticles-based devices are disclosed that show a better performance than similar devices without nanoparticles. Metal nanoparticles such as gold nanorods due to their size dependent optical activities are used in such devices, as light absorbers and heat generators. Two examples of such nanoparticles-based devices are disclosed which are photodetectors and electricity generators.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims.

REFERENCES

1. P. L. Richards, "Bolometers for infrared and millimeter waves", *J. Appl. Phys.*, 1994, 76, 1.
2. G. Matyi, "Nanoantennas for uncooled, double-band, CMOS compatible, high-speed infrared sensors", *Int. J. Circ. Theon. Appl.* 2004, 32, 425-430.
3. F. J. González, B. Ilic, J. Alda, G. D. Boreman, "Antenna-Coupled Infrared Detectors for Imaging Applications", 2005, *IEEE J. Selec. Top. Quant. Elects;* 11, 117-120.
4. Nikoobakht, B.; El-Sayed, M. A. "Preparation and Growth Mechanism of Gold Nanorods (NRs) Using Seed-Mediated Growth Method" *Chem. Mater.* 2003, 15, 1957-1962.
5. R. W. Gooch, T. R. Schimert, W. L. McCardel, B. A. Ritchey, "Microbolometer and Method for Forming", U.S. Pat. No. 6,690,014 B1.
6. X. Huang, I. H. El-Sayed, W. Qian, M. A. El-Sayed, "Cancer Cell Imaging and Photothermal Therapy in the Near-Infrared Region by Using Gold Nanorods", *J. Am. Chem. Soc.* 2006, 128, 2115-2120.
7. S.-W. Han, D. P. Neikirk, "Design of Infrared Wavelength-Selective Microbolometers using Planar Multimode Detectors", 2005, *Proc. SPIE* Smart Sensors, Actuators, and MEMS II, 5836, 549-557.
8. K. Deb, "Hybridized Biological Microbolometer", U.S. Pat. No. 6,160,257.
9. F. J. Gonzalez; C. S. Ashley; P. G. Clem; G. D. Boreman, "Antenna-coupled microbolometer arrays with aerogel thermal isolation" *Infrared Phys. & Technol.* 2004, 45, 47-51.

The invention claimed is:

1. A microbolometer or thermopile comprising a substrate and a light detector, wherein the light detector comprises ordered arrays of nanomaterial embedded in a matrix that enhances light absorption and releases heat for enhanced sensitivity.

2. The device according to claim 1, wherein the nanomaterial comprises nanorods, nanospheres or nanocrystals.

3. The device of claim 2 wherein the nanomaterial comprises aligned nanorods.

4. The device of claim 3 wherein the aligned nanorods are gold nanorods.

5. The device of claim 4 wherein the gold nanorods have an aspect ratio greater than two.

6. The device of anyone of claims 1-5 wherein the substrate is a monocrystalline silicon wafer or an organic thin film.

7. The device of claim 4 or 5 wherein spacing between adjacent nanorods is between 10 and 50 nm.

8. The microbolometer of claim 1 having a size of 3-50 microns square.

9. In a thermal photodetector comprising a mircrobolometer or thermopile, the improvement wherein the mircrobolomeer or thermopile is in accordance with claim 1.

10. In a thermal imaging camera or an infra-red camera comprising a thermal photodetector, the improvement wherein the thermal photodetector is in accordance with claim 9.

11. A method of integrating a nanomaterial in an electro-optical device for enhanced sensitivity, the method comprising:
   providing a substrate;
   forming on the substrate a conductive matrix which sandwiches an ordered array of nanomaterials, and
   connecting the matrix and the ordered array of nanomaterials to two separate conductive layers to form an electro-optical device,
   wherein the plurality of ordered arrays of nanomaterials operably change the conductivity of the matrix.

12. The method according, to claim 11, wherein the nanomaterial is homogenously integrated in planar form as a monolayer.

13. The method of claim 11, wherein the nanomaterial is hormogenously integrated in a planar form as a multilayer.

14. The method of any one of claim 12 or 13, wherein the nanomaterial comprises nanorods, nanospheres, nanoshells or nanocrystals.

15. The method of claim 14 wherein the nanomateriai comprises aligned nanorods.

16. The method of claim 15 wherein the aligned nanorods are gold nanorods.

17. The method of claim 16 wherein the gold nanorods have an aspect ratio greater than two.

18. The method of claims 11 wherein the substrate is a monocrystalline silicon wafer or an organic thin film.

19. The method of claim 16 wherein spacing between adjacent nanorods is between 10 and 50 nm.

20. The microbolometer of claim 8 having a size of 3-50 microns square.

21. In a thermal photodetector comprising a mircrobolometer or thermopile, the improvement wherein the mircrobolometer or thermopile is in accordance with claim 11.

22. In a thermal imaging camera or an infra-red camera comprising a thermal photodetector, the improvement wherein the thermal photodetector is in accordance with claim 21.

* * * * *